(12) United States Patent
Fryda et al.

(10) Patent No.: US 8,597,731 B2
(45) Date of Patent: Dec. 3, 2013

(54) METHOD FOR APPLYING A DIAMOND LAYER ONTO A GRAPHITE SUBSTRATE

(75) Inventors: Matthias Fryda, Itzehoe (DE); Thorsten Matthee, Hohenaspe (DE); Shane Mulcahy, Hamburg (DE)

(73) Assignee: Condias GmbH, Itzehoe (DE)

( * ) Notice: Subject to any disclaimer, the term of this patent is extended or adjusted under 35 U.S.C. 154(b) by 916 days.

(21) Appl. No.: 12/338,107

(22) Filed: Dec. 18, 2008

(65) Prior Publication Data

US 2009/0162549 A1 Jun. 25, 2009

(30) Foreign Application Priority Data

Dec. 21, 2007 (EP) .................................... 07024950

(51) Int. Cl.
*C23C 16/44* (2006.01)

(52) U.S. Cl.
USPC ................ 427/249.12; 427/248.1; 427/249.8; 427/307; 427/314; 427/316; 427/322

(58) Field of Classification Search
USPC .............. 427/248.1, 249.8, 249.12, 307, 314, 427/316, 322
See application file for complete search history.

(56) References Cited

U.S. PATENT DOCUMENTS

| | | | | |
|---|---|---|---|---|
| 4,988,421 A | * | 1/1991 | Drawl et al. ................ | 204/192.3 |
| 6,533,916 B1 | * | 3/2003 | Puetter et al. ................ | 205/188 |
| 6,893,971 B2 | * | 5/2005 | Tanabe et al. ................ | 438/706 |
| 7,081,420 B2 | * | 7/2006 | Kamata et al. ................ | 438/778 |
| 7,273,536 B2 | * | 9/2007 | Shibata et al. ................ | 204/294 |

OTHER PUBLICATIONS

M. Fryda, et al., "Fabrication and application of DIACHEM electrodes" Diamond and Related Materials, pp. 1950-1956 12 (2003).

\* cited by examiner

*Primary Examiner* — Queenie Dehghan
(74) *Attorney, Agent, or Firm* — Whitham Curtis Christofferson & Cook, PC

(57) ABSTRACT

A diamond layer can be applied stably onto a graphite substrate in a CVD process when the graphite substrate is subjected to the following pretreatment steps before the CVD process:
- fine cleaning of the surface in a vacuum at a temperature >500° C., preferably >800° C., in an etching gas atmosphere,
- mechanical removal of loose particles,
- seeding of the substrate surface with very small diamond particles and
- at least one degassing treatment in a vacuum to remove adsorbed hydrocarbons and adsorbed air at a temperature T>500° C., preferably T>700° C.

13 Claims, No Drawings

METHOD FOR APPLYING A DIAMOND LAYER ONTO A GRAPHITE SUBSTRATE

The invention relates to a method for applying a diamond layer onto a graphite substrate by a CVD process.

It is known that diamond coatings can be produced on suitable substrates by depositing diamond crystals from a gas phase containing carbon in a vacuum coating system in a CVD (chemical vapor deposition) process. The process gases here are hydrogen ($H_2$) and methane ($CH_4$). Deposition of the diamond phase ($sp^3$ carbon modification) requires that the per se thermodynamically more stable crystalline phase of carbon ($sp^2$ carbon modification—graphite) be suppressed. To this end a high concentration of atomic hydrogen is used, since the hydrogen atoms stabilize the diamond growth by breaking double bonds and selectively etching away the undesired carbon phases. The required growth conditions are generated by activating the process gas thermally or by plasma. It is known to use 1% methane in hydrogen as a process gas and a growth temperature of from 700 to 1000° C., as well as a gas pressure of between 40 and 100 mbar.

There is a demand for electrochemical applications in which diamond electrodes are constructed with a diamond layer on a graphite electrode body as a graphite substrate. The problem in producing a diamond coating on a graphite substrate by the CVD process is that the CVD coating always also forms carbon, which is etched away by the atomic hydrogen and thereby removed. When using a graphite substrate, the substrate forms a virtually inexhaustible source of etchable carbon so that the conventional CVD method cannot be used for the diamond coating of a graphite substrate.

A solution to the problem has been found in providing the graphite substrate with an inert metal layer as an interlayer, for example of gold, in order to achieve decoupling of the etching of the graphite substrate from the etching away of unintentionally formed $sp^2$ carbon modifications during the CVD process. This solution, however, is not usable for many electrochemical applications since even noble metals are not stable in many electrolytes.

The invention is therefore based on the problem that a diamond electrode with a graphite substrate is not available for certain electrochemical applications, since direct application of a diamond coating onto a graphite substrate has not been reliably achieved.

It is therefore the object of the invention to permit reliable diamond coating on a graphite substrate.

In order to achieve this object, the graphite substrate is subjected to the following pretreatment steps before the CVD process:
  fine cleaning of the surface in a vacuum at a temperature >500° C., preferably >800° C., in an etching gas atmosphere,
  mechanical removal of loose particles,
  seeding of the substrate surface with very small diamond particles and
  at least one degassing treatment in a vacuum to remove adsorbed hydrocarbons and adsorbed air at a temperature T>500° C., preferably T>700° C.

For the first time, the method according to the invention allows direct application of a diamond layer on a graphite substrate in a CVD process. The method according to the invention is based on the discovery that the graphite substrate, preferably in the form of an electrode body, must be pretreated in a suitable way, the pretreatment being intended to ensure that a continuous diamond layer is rapidly formed during the coating in the CVD process, which serves as a protective layer for the substrate and protects the substrate from the etching with the hydrogen gas. Once the protective layer is formed, the coating process proceeds as for a conventional metallic electrode body.

The method according to the invention may, if necessary, be preceded by a coarse cleaning step by which any fat and/or oil residues are removed, so that it is possible for the diamond layer to grow on the graphite substrate. An essential step of the method according to the invention consists in seeding the surface of the graphite substrate. The seeding, which is known per se, is prepared for according to the invention by the substrate surface being finely cleaned, specifically by an etching process. To this end the surface of the graphite substrate in a vacuum is subjected to a temperature >500° C., preferably >700° C. and particularly preferably >800° C., in an etching gas atmosphere, preferably a hydrogen atmosphere. During this treatment, graphite particles are exposed from the graphite. Marginal groups, for example in the form of CH3, $CH_2$, CO groups, can therefore be formed from the graphite composite into loose particles, which are subsequently removed mechanically. After the surface of the graphite substrate has been etched free in this way, the substrate surface is seeded with very small diamond particles. In a manner known per se, the effect of the seeding is that the growing diamond layer accumulates on diamond material already present, and can therefore grow more rapidly and more homogeneously than without seeding. The seeding may be carried out by means of a suspension with an alcoholic or aqueous liquid. This liquid is drawn into the porous surface of the graphite and adsorbed there, so that a uniform distribution of the diamond particles takes place over the surface of the graphite substrate.

Graphite substrates conventionally consist not of solid material, but of sintered and/or pressed material. This means that the graphite substrate has a considerable porosity. The porosity varies according to the graphite types, depending on the production parameters and production method. For the method according to the invention, it is important to remove the air, hydrocarbons and water which have accumulated owing to the pretreatment steps on the surface or on the pore surfaces accessible from the surface. According to the invention, the graphite substrate is therefore subjected to at least one degassing treatment in order to remove adsorbed hydrocarbons and adsorbed air. To this end, a temperature >500° C., preferably >700° C. and particularly preferably >800° C. is used. If the graphite substrate has been treated with water, for example during the seeding, the degassing treatment is also carried out to remove all the water.

For the first time, the pretreatment according to the invention makes it possible to produce durable diamond coatings on graphite substrates, in particular for diamond electrodes with graphite as an electrode body. New application fields are therefore opened up for diamond electrodes.

It should be noted that the method steps according to the invention are necessary for the pretreatment of the graphite substrate, but not in a particular predetermined sequence. For instance, the mechanical removal of the loose particles may also be carried out at the end of the degassing treatment, or additionally at the end of the degassing treatment. It is furthermore conceivable for the seeding of the substrate surface with the diamond particles to take place after the degassing treatment. If the seeding in a preferred embodiment is carried out by means of a suspension, it is subsequently merely necessary to remove the suspension liquid in a desorption step.

The coarse cleaning step is preferably carried out with an organic solvent, for example isopropanol. It is expedient then to carry out a desorption step in order to remove the solvent at an elevated temperature >150° C., for example 170° C. This desorption in the context of a heat treatment will be carried out for a sufficient time depending on the thickness and porosity of the graphite substrate.

The fine cleaning process is preferably carried out in a hydrogen atmosphere with a gas pressure <10 mbar. Here again, the duration of the treatment depends on the porosity and thickness of the graphite substrate.

The mechanical removal of the loose particles from the graphite surface may preferably be carried out by wiping or blowing the surface.

The degassing treatment at the elevated temperature (>500° C.) provided according to the invention, to remove adsorbed hydrocarbon and adsorbed air, preferably takes place immediately before the CVD process. Optionally, the removal of loose particles may be carried out only for the first time or again.

The pretreatment steps according to the invention may also be carried out in several stages. For instance, it may be expedient for a solvent used for degreasing then to be removed immediately in a suitable desorption step. The same applies for removal of the solvent when the seeding of the graphite surface is carried out with a diamond suspension. These intermediate steps facilitate the primary degassing treatment by which adsorbed hydrocarbons and adsorbed air are removed from the surface, and in particular from surface-accessible pores.

In an example, the pretreatment according to the invention was carried out as follows:
    coarse cleaning of the graphite surface for degreasing/oil removal by means of isopropanol as an organic solvent,
    desorption step to remove the solvent and the desorbed water by means of a heat treatment at 170° C. for two hours for a 10 mm thick graphite substrate,
    degassing the hydrocarbons and the air in a vacuum (pressure <10 mbar) for 10 hours,
    fine cleaning of the surface by treatment in a vacuum method by means of a heat treatment at 870° C. in hydrogen gas at a gas pressure of 7 mbar for about one hour,
    mechanical removal (by wiping) of the loose particles formed on the surface by the fine cleaning,
    seeding the graphite surface with a diamond suspension by means of an aqueous/alcoholic suspension medium,
    desorption step to remove the aqueous suspension medium by means of a heat treatment at 170° C. for about two hours in air (for the 10 mm thickness of the graphite substrate),
    degassing the hydrocarbons and the air before the actual coating step at a temperature of more than 800° C. for 10 hours in a vacuum.

This example makes it clear that two degassing treatments are carried out, in order to achieve reliable removal of adsorbed hydrocarbons and adsorbed air in two steps. The treatment times used in this case are not optimized; rather they are set to a treatment time which is reliably long enough.

In the subsequent diamond coating by the CVD process, the parameters are set so that strong etching of the graphite takes place. By the pretreatment and the seeding, a rapid continuous diamond layer is formed which protects the graphite substrate from further etching by the hydrogen gas, so that the further layer growth takes place in the conventional way and can be adjusted by the conventional parameters of the CVD process. The preferred gas phase composition is 1% $CH_4$ in $H_2$, and the preferred gas pressure during the coating is from 5 to 50 mbar, more preferably from 10 to 30 mbar, particularly preferably from 10 to 20 mbar.

The invention claimed is:

1. Method for applying a diamond layer onto a graphite substrate by a CVD process, in which the graphite substrate is subjected to the following pretreatment steps before the CVD process:
    fine cleaning by etching a substrate surface in a vacuum at a temperature >500° C. in an etching gas atmosphere,
    mechanical removal of loose particles of graphite formed from etch products that occur during the fine cleaning step in said etching gas atmosphere,
    seeding directly on the substrate surface very small diamond particles and
    at least one degassing treatment in a vacuum to remove adsorbed hydrocarbons and adsorbed air at a temperature T>500° C.

2. Method according to claim 1, wherein the fine cleaning process is carried out in a hydrogen atmosphere.

3. Method according to claim 2, wherein the hydrogen atmosphere is set at a gas pressure <10 mbar.

4. Method according to claim 1, wherein the seeding of the substrate surface is carried out with a diamond particle suspension.

5. Method according to claim 4, wherein the suspension medium is subsequently removed by heating the graphite substrate.

6. Method according to claim 1, wherein the degassing treatment takes place immediately before the CVD process.

7. Method according to claim 1, wherein the CVD process is carried out with a gas composition of from 0.5 to 3.0% methane in hydrogen.

8. Method according to claim 7 wherein said gas composition is 2% methane in hydrogen.

9. Method according to claim 1, which is preceded by a coarse cleaning step.

10. Method according to claim 9, wherein the coarse cleaning step is carried out with an organic solvent.

11. Method according to claim 10, wherein a desorption step is subsequently carried out to remove the solvent at an elevated temperature >150° C.

12. Method according to claim 1 wherein said step of fine cleaning of the surface in a vacuum is performed at a temperature >800° C.

13. Method according to claim 1 wherein said step of at least one degassing treatment in a vacuum to remove adsorbed hydrocarbons and adsorbed air is performed at a temperature T>700° C.

* * * * *